United States Patent
Rumpf, Jr. et al.

(10) Patent No.: US 6,825,743 B2
(45) Date of Patent: Nov. 30, 2004

(54) SUBSTRATE ENHANCEMENT FOR IMPROVED SIGNAL CHARACTERISTICS ON A DISCONTINUOUS TRANSMISSION LINE

(75) Inventors: Raymond Charles Rumpf, Jr., Melbourne, FL (US); William D. Killen, Melbourne, FL (US); Randy T. Pike, Grant, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/185,162

(22) Filed: Jun. 27, 2002

(65) Prior Publication Data

US 2004/0000978 A1 Jan. 1, 2004

(51) Int. Cl.[7] .................................................. H01P 3/08
(52) U.S. Cl. ...................................... 333/238; 333/236
(58) Field of Search .............................. 333/236, 238, 333/245, 246, 247

(56) References Cited

U.S. PATENT DOCUMENTS

| | | |
|---|---|---|
| 3,571,722 A | 3/1971 | Vendelin |
| 3,654,573 A | 4/1972 | Graham |
| 3,678,418 A | 7/1972 | Woodward |
| 4,495,505 A | 1/1985 | Shields |
| 4,525,720 A | 6/1985 | Corzine et al. |
| 4,800,344 A | 1/1989 | Graham |
| 4,825,220 A | 4/1989 | Edward et al. |
| 4,882,553 A | 11/1989 | Davies et al. |
| 4,916,410 A | 4/1990 | Littlefield |
| 4,924,236 A | 5/1990 | Schuss et al. |
| 5,039,891 A | 8/1991 | Wen et al. |
| 5,148,130 A | 9/1992 | Dietrich |
| 5,379,006 A | 1/1995 | McCorkle |
| 5,455,545 A | 10/1995 | Garcia |
| 5,523,728 A | 6/1996 | McCorkle |
| 5,678,219 A | 10/1997 | Agarwal et al. |
| 6,052,039 A | 4/2000 | Chiou et al. |
| 6,114,940 A | 9/2000 | Kakinuma et al. |
| 6,133,806 A | 10/2000 | Sheen |
| 6,137,376 A | 10/2000 | Imbornone et al. |
| 6,184,845 B1 | 2/2001 | Leisten et al. |
| 6,307,509 B1 | 10/2001 | Krantz |

FOREIGN PATENT DOCUMENTS

| | | |
|---|---|---|
| DE | 32 14 471 | 10/1983 |
| GB | 613 241 | 11/1948 |
| JP | 01 245601 | 9/1989 |
| JP | 09 260797 | 10/1997 |
| JP | 2002 026640 | 1/2002 |
| WO | WO 01 01453 | 1/2001 |

*Primary Examiner*—Don Le
(74) *Attorney, Agent, or Firm*—Sacco & Associates, PA

(57) ABSTRACT

A circuit for processing radio frequency signals. The circuit can include a substrate board that has at least one dielectric layer (100) having a first set of substrate properties over a first region (102). The first set of substrate properties can include a first permittivity and a first permeability. A second region (140) can be provided with a set of second substrate properties. The second region can have a second set of substrate properties including a second permittivity and a second permeability. The second permittivity can be different than the first permittivity and/or the second permeability can be different than the first permeability. A first transmission line (102) having at least one discontinuity can be coupled to the second region (108). The discontinuity can include a bend, corner, non-uniformity, break in the transmission line, or a junction between the first transmission line and a second transmission line.

11 Claims, 2 Drawing Sheets

SUBSTRATE ENHANCEMENT FOR IMPROVED SIGNAL CHARACTERISTICS ON A DISCONTINUOUS TRANSMISSION LINE

BACKGROUND OF THE INVENTION

1. Statement of the Technical Field

The inventive arrangements relate generally to methods and apparatus for providing increased design flexibility for RF circuits, and more particularly for optimization of dielectric circuit board materials for improved performance in transmission lines.

2. Description of the Related Art

RF circuits are typically formed in one of three ways. One configuration known as microstrip places a transmission line on a board surface and provides a second conductive layer, commonly referred to as a ground plane. A second type of configuration known as buried microstrip is similar except that the transmission line is covered with a dielectric substrate material. In a third configuration known as stripline, the transmission line is sandwiched in dielectric between two electrically conductive (ground) planes.

In conventional RF designs, transmission lines often have discontinuities, such as angles, bends, terminations and junctions. Notably, the discontinuities can cause undesirable affects such as ringing and reflection of RF signals conducted through the lines, resulting in voltage and impedance variations in the circuit. These voltage and impedance variations often degrade the RF signals, contribute to circuit resonances and increase electromagnetic interference (EMI) generated by the circuit. This can be especially of concern at RF frequencies above 1 GHz.

Circuit designers often attempt to minimize signal reflection and ringing by minimizing the usage of 90° angles, sharp bends, and vias in a circuit. One technique commonly used is to make the bend radius of transmission lines relatively large, roughly three times the width of the transmission line. Another technique is to chamfer sharp angles in transmission lines. Nonetheless, these techniques generally are only moderately effective at controlling signal degradation, circuit resonances, and EMI.

SUMMARY OF THE INVENTION

The present invention relates to a circuit for processing radio frequency signals. The circuit includes a substrate board that has at least one dielectric layer having a first set of substrate properties over a first region and a second set of substrate properties over a second region. The substrate properties can include a permittivity and a permeability. The substrate properties of the second region can be different that the substrate properties of the first region. The substrate can comprise a meta-material and can be differentially modified to vary at least one of the permittivity and the permeability over a selected region.

The circuit also can include at least a first transmission line coupled to the substrate, the transmission line having at least one discontinuity. The discontinuity can include a bend, corner, via, non-uniformity, or transition in the first transmission line. The discontinuity also can include a junction between the first transmission line and a second transmission line or a transition/interconnect to a discrete circuit component. In one embodiment a transition element can be provided at the junction.

The discontinuity can be coupled to the second substrate region to reduce an amount of signal distortion and ringing caused by the discontinuity. The second region can be structured to be a column shape with a triangular or oval cross section. In another embodiment the second region can be in the shape of a cylinder.

DETAILED DESCRIPTION OF THE PREFERRED EMBODIMENTS

Transmission lines often have discontinuities, such as angles, bends, vias, terminations, and junctions. Notably, the discontinuities can cause undesirable ringing and distortion of radio frequency (RF) signals conducted through the lines, resulting in voltage and impedance variations in the circuit. The present invention offers a novel technique for improving circuit board RF performance by providing varying permittivity and/or permeability in circuit board regions proximate to the discontinuities. The varying permittivity and/or permeability reduces the amount of signal reflection and ringing caused by the discontinuity.

Figure 1:
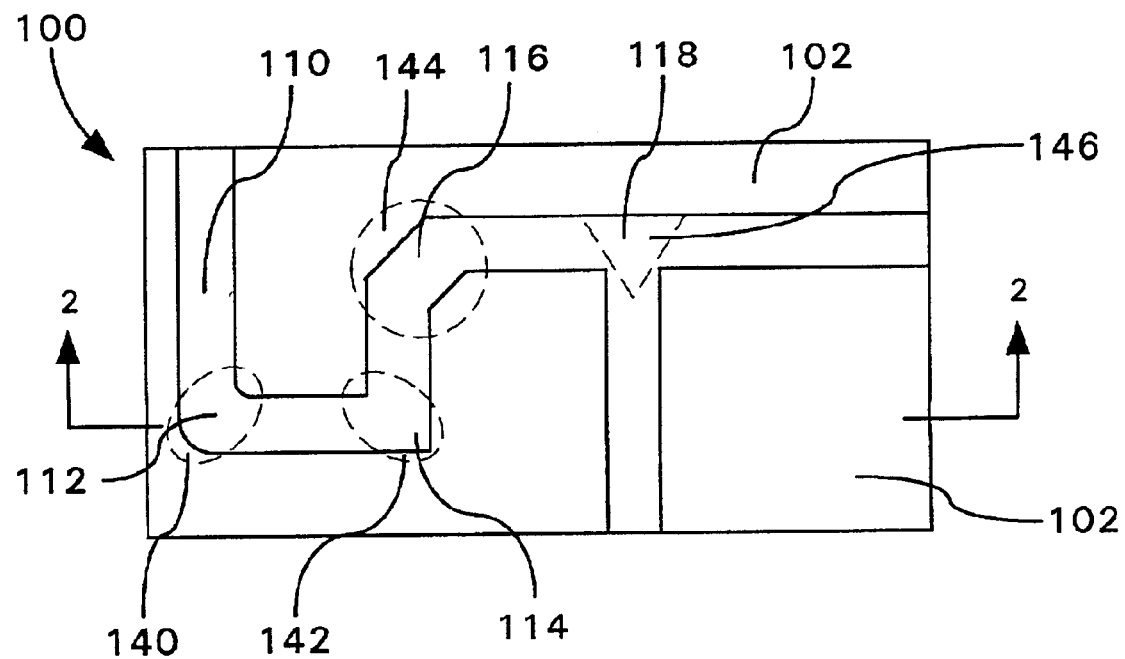
FIG. 1 is a top view of a transmission line structure including substrate regions having associated substrate properties to improve signal characteristics in a discontinuous transmission line.
Figure 2:
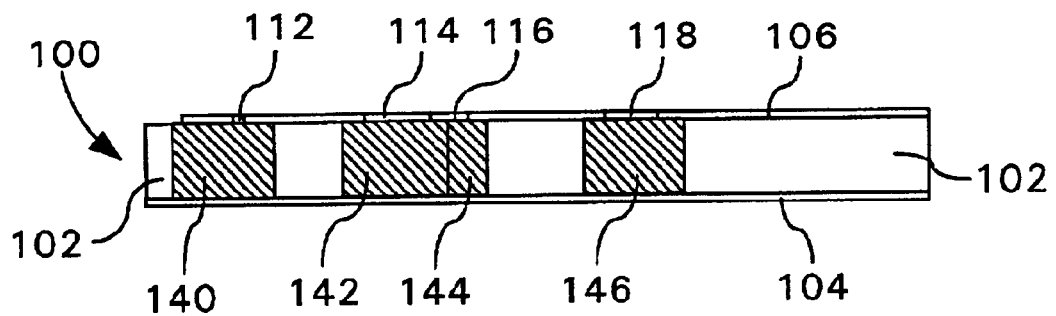
FIG. 2 is a cross-sectional view of the substrate of FIG. 1 taken along section line 2—2.

The present invention is implemented in a substrate board including dielectric layer 100, as shown in FIGS. 1 and 2. The dielectric layer comprises a first region 102 having a first set of substrate properties and one or more modified regions 140, 142, 144 and 146 having substrate properties different than the first region's substrate properties. The substrate properties can include a permittivity and a permeability. Importantly, the substrate properties of the modified region can be different than the first set of substrate properties. For example, at least one modified region 140, 142, 144 and 146 can have a higher permittivity and permeability than the first region 102.

A transmission line 110 and a ground plane 104 are coupled to the dielectric layer 100. The transmission line 110 can be coupled to a first side of the dielectric layer 100 in a microstrip configuration, opposite the ground plane 104 coupled to a second side of the dielectric layer 100. Other configurations such as buried microstrip and stripline, also can be used.

The transmission line 110 has at least one discontinuity along its length, for example a radius 112, an angle 114, a chamfered angle 116, and a T-junction 118. Notably, the present invention can be used with other types of circuit discontinuities. In the preferred embodiment, discontinuities are coupled to modified regions 140–146 while continuous portions of the transmission line are coupled to the first region 102. Significantly, the permittivity and/or permeability of the modified regions 140–146 can be controlled to reduce signal ringing and distortion caused by the discontinuities.

The propagation velocity of a signal traveling on the transmission line is approximately inversely proportional to $\sqrt{\mu_r \epsilon_r}$, where $\epsilon_r$ is the relative permittivity and $\mu_r$ is the relative permeability associated with the transmission line. It should be noted, however, that both the relative permittivity and relative permeability are parameters primarily varied around the regions proximate to the transmission line. In the present example the proximate regions are the substrate region coupled to the transmission line and the air above the transmission line.

In one embodiment, the reflections and distortions produced in region 114 can be reduced by varying the relative permittivity and permeability in a manner such that the electrical length around any radius of the bend is approximately equal. This is accomplished by decreasing the propagation velocity near the inside of the bend by increasing the relative permittivity and permeability. The specific values of the relative permittivity and permeability are chosen to separately control propagation velocity and impedance in localized manner within region 114.

FIG. 2 is sectional view, shown along section line 2—2, of the transmission line 110 and the dielectric layer 100 of FIG. 1. In one arrangement the second modified regions 140–146 can be shaped as columns extending from the transmission line 110 to the ground plane 104. The cross sectional shape of the columns can be optimized for the particular type of discontinuities 112–118 proximate to the modified regions 140–146. For example, modified regions 140 and 142 can have an oval cross section (oval column). Modified region 144 can have a circular cross section (cylinder) and modified section 118 can have a triangular cross section (triangular column). Still, other shapes can be used, for example, a sphere, a column having a square cross section, a non-uniform three-dimensional object, etc. The relative permittivity and permeability within the vicinity of the discontinuity (within the column) can vary within the column to as to optimize its affect on the RF signal. The shape of the column and distribution of material properties can be different depending on the type of transmission line, field distribution, and type of discontinuity.

Figure 3:
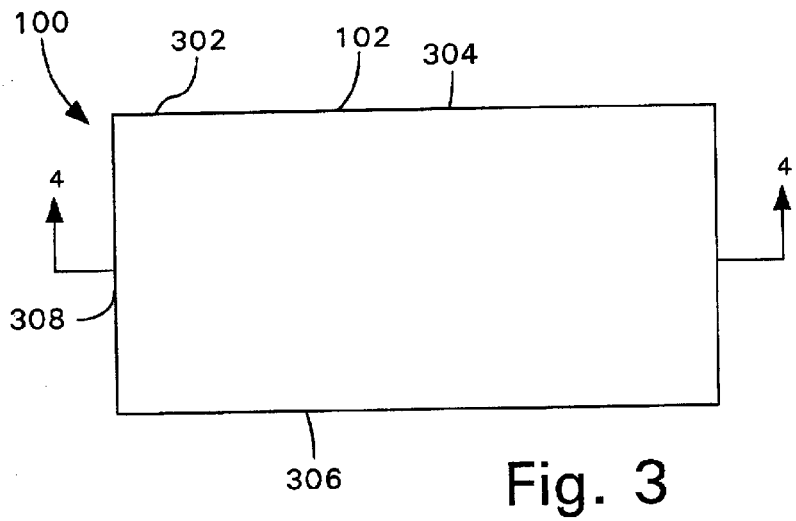
FIG. 3 is a top view of an alternate embodiment of a transmission line structure including a substrate region having associated substrate properties to improve signal characteristics in a discontinuous transmission line in accordance with the present invention.
Figure 4:
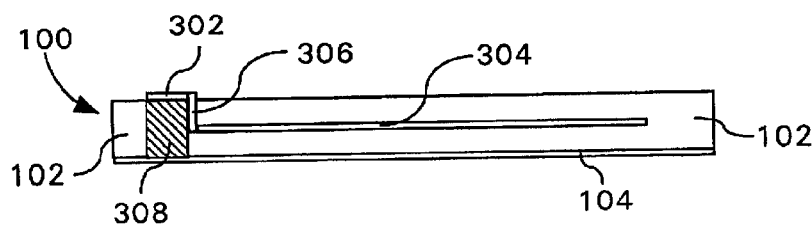
FIG. 4 is a cross-sectional view of the substrate of FIG. 3 taken along section line 4—4.

Another circuit arrangement is shown FIGS. 3 and 4. Second transmission line 302 is coupled to the top of the dielectric layer 100 and third transmission line 304 is sandwiched within the dielectric layer 100. In the example shown, the third transmission line 304 is perpendicular to the second transmission line 302 and primarily contained within the first region 102 in a buried microstrip or stripline arrangement. A transition element 306 provides a junction between the second and third transmission lines 302 and 304.

This type of circuit arrangement can be beneficial for certain types of resonant lines, but typically can incorporate multiple discontinuities between the transmission lines 302 and 304. The transition element 306 is proximate to a modified region 308. In a preferred embodiment the transition element 306 is contained within the modified region 308. This configuration can reduce signal ringing, signal distortion, and unintended signal reflections for signals passing through the multiple discontinuous line sections that can be provided in this arrangement. In one embodiment of FIGS. 3 and 4, transition element 306 could be a via connecting microstrip 302 to stripline 304. The sharp transition adds parasitic impedance that distorts a passing RF signal. The behavior of 308 to reduce the undesired affects of the discontinuity can be described in many ways. One description is that intentional parasitic impedance is introduced by the material properties in 308 to cancel the parasitic impedance of 306 alone. A second description is that the material properties in 308 are such that proper boundary conditions are introduced to couple energy from 302 to 304 without reflection, radiation, distortion, or other undesired affects.

It should be noted that the invention is not limited to the exemplary figures shown. Importantly, the present invention can be used to reduce signal ringing, distortion, and reflections caused by any other transmission line discontinuities. For example, the present invention can be used with circuits having non-uniformities, stepped impedance, and/or transitions in a transmission line.

In one embodiment, the permittivity and/or permeability can be differentially modified at selected regions of the dielectric layer to optimize transmission line performance. The term "differential modifying" as used herein refers to any modifications, including additions, to the dielectric layer 100 that result in at least one of the dielectric and magnetic properties being different at one region of the substrate as compared to another region. For example, the modification can be selective modification where certain dielectric layer regions are modified to produce a first set of dielectric or magnetic properties, while other dielectric layer regions are left unmodified having dielectric and magnetic properties different from the first set of properties resulting from the modification. It is also important to note that dielectric and magnetic properties also include loss. For example, a conductor would be a special case of a dielectric material.

Figure 5:
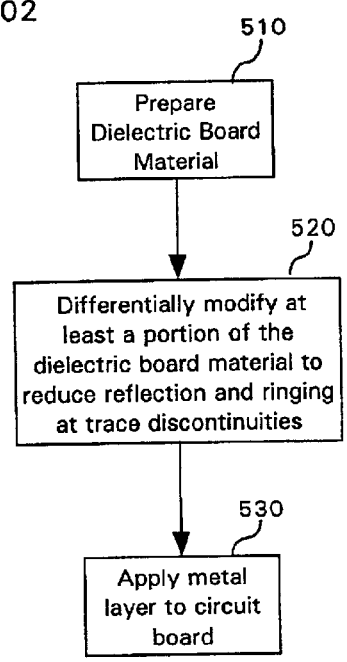
FIG. 5 is a flow chart that is useful for illustrating a process for manufacturing a substrate having associated substrate properties to improve signal characteristics in a discontinuous transmission line.

A method for providing a substrate optimized to reduce signal ringing, signal distortion, and unintended reflections is described with reference to the text below and the flow chart presented in FIG. 5. In step 510, board dielectric material is prepared for modification. The board material can include commercially available off the shelf board material or customized board material formed from a polymer material, or some combination thereof. The preparation process can be made dependent upon the type of board material selected.

In step 520, one or more dielectric layer regions, such as the first region 102 and/or the second region 104, can be differentially modified so that the permittivity and/or permeability differ between two or more regions. The differential modification can be accomplished in several different ways, as previously described. Referring to step 530, the metal layer then can be applied to the resonant line using standard circuit board techniques known in the art.

Dielectric substrate boards having meta-material regions providing localized and selectable magnetic and substrate properties can be prepared in the following manner. As defined herein, the term "meta-materials" refers to composite materials formed from the mixing or arrangement of two or more different materials at a very fine level, such as the molecular or nanometer level. Metamaterials allow tailoring of electromagnetic properties of the composite, which can be defined by effective electromagnetic parameters comprising effective electrical permittivity $\epsilon_{eff}$ (or permittivity) and the effective magnetic permeability $\mu_{eff}$.

Appropriate bulk dielectric substrate materials can be obtained from commercial materials manufacturers, such as DuPont and Ferro. The unprocessed material, commonly called Green Tape™, can be cut into sized regions from a bulk dielectric tape, such as into 6 inch by 6 inch regions. For example, DuPont Microcircuit Materials provides Green Tape material systems, such as 951 Low-Temperature Cofire Dielectric Tape and Ferro Electronic Materials ULF28–30 Ultra Low Fire COG dielectric formulation. These substrate materials can be used to provide dielectric layers having relatively moderate permittivities with accompanying relatively low loss tangents for circuit operation at microwave frequencies once fired.

In the process of creating a microwave circuit using multiple sheets of dielectric substrate material, features such as vias, voids, holes, or cavities can be punched through one or more layers of tape. Voids can be defined using mechanical means (e.g. punch) or directed energy means (e.g., laser drilling, photolithography), but voids can also be defined using any other suitable method. Some vias can reach through the entire thickness of the sized substrate, while some voids can reach only through varying regions of the substrate thickness.

The vias can then be filled with metal or other dielectric or magnetic materials, or mixtures thereof, usually using stencils for precise placement of the backfill materials. The individual layers of tape can be stacked together in a conventional process to produce a complete, multi-layer substrate. Alternatively, individual layers of tape can be stacked together to produce an incomplete, multi-layer substrate generally referred to as a sub-stack.

Voided regions can also remain voids. If backfilled with selected materials, the selected materials preferably include meta-materials. The choice of a metamaterial composition can provide tunable effective dielectric constants over a relatively continuous range from less than 2 to about 2650. Tunable magnetic properties are also available from certain meta-materials. For example, through choice of suitable materials the relative effective magnetic permeability generally can range from about 4 to 116 for most practical RF applications. However, the relative effective magnetic permeability can be as low as about 2 or reach into the thousands.

The term "differentially modified" as used herein can refer to modifications, including dopants, to a dielectric substrate layer that result in at least one of the dielectric and magnetic properties being different at one region of the substrate as compared to another region. A differentially modified board substrate preferably includes one or more metamaterial containing regions.

For example, the modification can be selective modification where certain dielectric layer regions are modified to produce a first set of dielectric or magnetic properties, while other dielectric layer regions are modified differentially or left unmodified to provide dielectric and/or magnetic properties different from the first set of properties. Differential modification can be accomplished in a variety of different ways.

According to one embodiment, a supplemental dielectric layer can be added to the dielectric layer. Techniques known in the art such as various spray technologies, spin-on technologies, various deposition technologies or sputtering can be used to apply the supplemental dielectric layer. The supplemental dielectric layer can be selectively added in localized regions, including inside voids or holes, or over the entire existing dielectric layer. For example, a supplemental dielectric layer can be used for providing a substrate region having an increased effective dielectric constant. The dielectric material added as a supplemental layer can include various polymeric materials.

The differential modifying step can further include locally adding additional material to the dielectric layer or supplemental dielectric layer. The addition of material can be used to further control the effective dielectric constant or magnetic properties of the dielectric layer to achieve a given design objective.

The additional material can include a plurality of metallic and/or ceramic particles. Metal particles preferably include iron, tungsten, cobalt, vanadium, manganese, certain rare-earth metals, nickel, or niobium particles. The particles are preferably nanosize particles, generally having sub-micron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coating.

Magnetic metamaterial particles that are generally suitable for controlling magnetic properties of dielectric layer for a variety of applications described herein include ferrite organoceramics (FexCyHz)-(Ca/Sr/Ba-Ceramic). These particles work well for applications in the frequency range of 8–40 GHz. Alternatively, or in addition thereto, niobium organoceramics (NbCyHz)-(Ca/Sr/BaCeramic) are useful for the frequency range of 12–40 GHz. The materials designated for high frequency are also applicable to low frequency applications. These and other types of composite particles can be obtained commercially.

In general, coated particles are preferable for use with the present invention as they can aid in binding with a polymer matrix or side chain moiety. In addition to controlling the magnetic properties of the dielectric, the added particles can also be used to control the effective dielectric constant of the material. Using a fill ratio of composite particles from approximately 1 to 70%, it is possible to raise and possibly lower the dielectric constant of substrate dielectric layer and/or supplemental dielectric layer regions significantly. For example, adding organofunctionalized nanoparticles to a dielectric layer can be used to raise the dielectric constant of the modified dielectric layer regions.

Particles can be applied by a variety of techniques including polyblending, mixing and filling with agitation. For example, a dielectric constant may be raised from a value of 2 to over 10 by using a variety of particles with a fill ratio of up to about 70%. Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

The selectable substrate properties can be localized to areas as small as about 10 nanometers, or cover large area regions, including the entire board substrate surface. Conventional techniques such as lithography and etching along with deposition processing can be used for localized dielectric and magnetic property manipulation.

Materials can be prepared mixed with other materials or including varying densities of voided regions (which generally introduce air) to produce effective dielectric constants in a substantially continuous range from 2 to about 2650, as well as other potentially desired substrate properties. For example, materials exhibiting a low dielectric constant (<2 to about 4) include silica with varying densities of voided regions. Alumina with varying densities of voided regions can provide a dielectric constant of about 4 to 9. Neither silica nor alumina have any significant magnetic permeability. However, magnetic particles can be added, such as up to 20 wt. %, to render these or any other material significantly magnetic. For example, magnetic properties may be tailored with organofunctionality. The impact on dielectric constant from adding magnetic materials generally results in an increase in the dielectric constant.

Medium dielectric constant materials have a dielectric constant generally in the range of 70 to 500+/−10%. As noted above these materials may be mixed with other materials or voids to provide desired effective dielectric constant values. These materials can include ferrite doped calcium titanate. Doping metals can include magnesium, strontium and niobium. These materials have a range of 45 to 600 in relative magnetic permeability.

For high dielectric constant applications, ferrite or niobium doped calcium or barium titanate zirconates can be used. These materials have a dielectric constant of about 2200 to 2650. Doping percentages for these materials are generally from about 1 to 10%. As noted with respect to other materials, these materials may be mixed with other materials or voids to provide desired effective dielectric constant values.

These materials can generally be modified through various molecular modification processing. Modification processing can include void creation followed by filling with materials such as carbon and fluorine based organofunctional materials, such as polytetrafluoroethylene PTFE.

Alternatively or in addition to organofunctional integration, processing can include solid freeform fabrication (SFF), photo, uv, x-ray, e-beam or ion-beam irradiation. Lithography can also be performed using photo, uv, x-ray, e-beam or ion-beam radiation.

Different materials, including meta-materials, can be applied to different areas on substrate layers (sub-stacks), so that a plurality of areas of the substrate layers (sub-stacks) have different dielectric and/or magnetic properties. The backfill materials, such as noted above, may be used in conjunction with one or more additional processing steps to attain desired, dielectric and/or magnetic properties, either locally or over a bulk substrate region.

A top layer conductor print is then generally applied to the modified substrate layer, sub-stack, or complete stack. Conductor traces can be provided using thin film techniques, thick film techniques, electroplating, or any other suitable technique. The processes used to define the conductor pattern include, but are not limited to standard lithography and stencil.

A base plate is then generally obtained for collating and aligning a plurality of modified board substrates. Alignment holes through each of the plurality of substrate boards can be used for this purpose.

The plurality of layers of substrate, one or more sub-stacks, or combination of layers and sub-stacks can then be laminated (e.g. mechanically pressed) together using either isostatic pressure, which puts pressure on the material from all directions, or uniaxial pressure, which puts pressure on the material from only one direction. The laminate substrate is then is further processed as described above or placed into an oven to be fired to a temperature suitable for the processed substrate (approximately 850 C to 900 C for the materials cited above).

The plurality of ceramic tape layers and stacked sub-stacks of substrates can then be fired, using a suitable furnace that can be controlled to rise in temperature at a rate suitable for the substrate materials used. The process conditions used, such as the rate of increase in temperature, final temperature, cool down profile, and any necessary holds, are selected mindful of the substrate material and any material backfilled therein or deposited thereon. Following firing, stacked substrate boards, typically, are inspected for flaws using an optical microscope.

The stacked ceramic substrates can then be optionally diced into cingulated pieces as small as required to meet circuit functional requirements. Following final inspection, the cingulated substrate pieces can then be mounted to a test fixture for evaluation of their various characteristics, such as to assure that the dielectric, magnetic, and/or electrical characteristics are within specified limits.

Thus, substrate materials can be provided with localized tunable dielectric and/or magnetic characteristics for improving the density and performance of circuits, including those comprising transmission lines. The dielectric flexibility allows independent optimization of circuit elements.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A circuit for processing radio frequency signals, comprising:
   a substrate board including at least one dielectric layer, said dielectric layer having a first set of substrate properties over a first region;
   a second region of said substrate board comprising a second set of substrate properties different from said first set of substrate properties; and
   at least a first transmission line coupled to said first region of said substrate board, said first transmission line having at least one discontinuity coupled to said second region of said substrate;
   wherein at least one of said first and second regions comprises a meta-material.

2. The circuit of claim 1 wherein said discontinuity comprises at least one of a bend, corner, via, non-uniformity, and transition in said first transmission line.

3. The circuit of claim 1 wherein said second region is structured to be a cylinder.

4. The circuit of claim 1 wherein said substrate comprises a functionally graded permittivity and permeability.

5. The circuit of claim 1 wherein at least one of said first set of substrate properties and said second set of substrate properties is differentially modified to vary at least one of a permittivity and a permeability over a selected region.

6. A circuit far processing radio frequency signals, comprising:
   a substrate board including at least one dielectric layer, said dielectric layer having a first permeability over a first region;
   a second region of said substrate board comprising a second permeability different from said first permeability; and
   at least a first transmission line coupled to said first region of said substrate board, said first transmission line having at least one discontinuity coupled to said second region of said substrate.

7. The circuit of claim 6, wherein said second permeability is larger than said first permeability.

8. A circuit for processing radio frequency signals, comprising:
   a substrate board including at least one dielectric layer, said dielectric layer having a first set of substrate properties over a first region;
   a second region of said substrate board comprising a second set of substrate properties different from said first set of substrate properties; and
   at least a first transmission line coupled to said first region of said substrate board, said first transmission line having at least one discontinuity coupled to said second region of said substrate;

wherein said discontinuity comprises a junction between said first transmission line and a second transmission line.

9. The circuit of claim 8 wherein said junction comprises a transition element, said transition element being congruent to said second region.

10. A circuit for processing radio frequency signals, comprising:
- a substrate board including at least one dielectric layer, said dielectric layer having a first set of substrate properties over a first region;
- a second region of said substrate board comprising second set of substrate properties different from said first set of substrate properties; and
- at least a first transmission line coupled to said first region of said substrate board, said first transmission line having at least one discontinuity coupled to said second region of said substrate;

wherein said second region is structured to be a column shape with triangular cross section.

11. A circuit for processing radio frequency signals, comprising;
- a substrate board including at least one dielectric layer, said dielectric layer having a first set of substrate properties over a first region;
- a second region of said substrate board comprising a second set of substrate properties different from said first set of substrate properties; and
- at least a first transmission line coupled to said first region of said substrate board, said first transmission line having at least one discontinuity coupled to said second region of said substrate;

wherein said second region is structured to be a column shape with an oval cross section.

* * * * *

UNITED STATES PATENT AND TRADEMARK OFFICE
CERTIFICATE OF CORRECTION

PATENT NO. : 6,825,743 B2
DATED : November 30, 2004
INVENTOR(S) : Rumpf et al.

It is certified that error appears in the above-identified patent and that said Letters Patent is hereby corrected as shown below:

Column 8,
Line 44, delete "far" and replace with -- for --.

Column 9,
Line 14, insert -- a -- between "comprising" and "second".

Signed and Sealed this

Sixteenth Day of August, 2005

JON W. DUDAS
*Director of the United States Patent and Trademark Office*